(12) United States Patent
Steadman et al.

(10) Patent No.: US 8,018,067 B2
(45) Date of Patent: Sep. 13, 2011

(54) ELECTRICALLY SHIELDED THROUGH-WAFER INTERCONNECT

(75) Inventors: Roger Steadman, Aachen (DE); Gereon Vogtmeier, Aachen (DE); Ralf Dorsheid, Kerkrade (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 734 days.

(21) Appl. No.: 12/063,774

(22) PCT Filed: Aug. 15, 2006

(86) PCT No.: PCT/IB2006/052809
§ 371 (c)(1),
(2), (4) Date: Feb. 14, 2008

(87) PCT Pub. No.: WO2007/023416
PCT Pub. Date: Mar. 1, 2007

(65) Prior Publication Data
US 2010/0171196 A1   Jul. 8, 2010

(30) Foreign Application Priority Data
Aug. 26, 2005   (EP) .................................. 05107848

(51) Int. Cl.
*H01L 23/48* (2006.01)
(52) U.S. Cl. ............... 257/774; 257/621; 257/E23.174; 438/637

(58) Field of Classification Search .................. 257/621, 257/774, 775, E23.174; 438/637
See application file for complete search history.

(56) References Cited

U.S. PATENT DOCUMENTS

| 3,698,082 | A | * | 10/1972 | Hyltin et al. | 29/856 |
| 5,286,926 | A |   | 2/1994  | Kimura et al. | |
| 6,052,287 | A | * | 4/2000  | Palmer et al. | 361/767 |
| 6,605,551 | B2| * | 8/2003  | Wermer et al. | 438/778 |
| 7,081,650 | B2| * | 7/2006  | Palanduz et al. | 257/310 |
| 7,157,372 | B1| * | 1/2007  | Trezza | 438/675 |
| 7,227,256 | B2| * | 6/2007  | Zhao et al. | 257/707 |
| 7,276,787 | B2| * | 10/2007 | Edelstein et al. | 257/698 |
| 7,508,079 | B2| * | 3/2009  | Higashi | 257/774 |
| 2001/0033509 | A1 | | 10/2001 | Ahn et al. | |
| 2003/0207566 | A1 | | 11/2003 | Forbes et al. | |
| 2004/0192029 | A1 | | 9/2004  | Hartwell | |
| 2005/0023650 | A1 | * | 2/2005 | Forbes | 257/664 |
| 2005/0146049 | A1 | | 7/2005  | Kripesh et al. | |
| 2006/0001174 | A1 | * | 1/2006 | Matsui | 257/774 |
| 2006/0035402 | A1 | * | 2/2006 | Street et al. | 438/66 |

* cited by examiner

Primary Examiner — Allan R Wilson

(57) ABSTRACT

Through-Wafer Interconnections allow for the usage of cost-effective substrates for detector chips. According to an exemplary embodiment of the present invention, detecting element for application in an examination apparatus may be provided, comprising a wafer with a sensitive region and a coaxial through-wafer interconnect structure. This may reduce the susceptibility of the interconnection by providing an effective shielding.

15 Claims, 3 Drawing Sheets

ELECTRICALLY SHIELDED THROUGH-WAFER INTERCONNECT

The present invention relates to the field of semiconductor physics. In particular, the present invention relates to an Electrically Shielded Through-Wafer Interconnect, to a detecting element for application in an examination apparatus, to an examination apparatus, and to a method of fabricating an Electrically Shielded Through-Wafer Interconnect.

Today's trends in Computed Tomography applications (CT applications) may, when it comes to large detectors, only be enabled by a technology that offers the possibility of tiling a number of detector chips in all directions. In order to allow for a use of cost-effective substrates, such as, for example, Complementary Metal Oxide Semiconductors (CMOS), vias may be used for transmitting signals from one side of the wafer to the other side. However, if a chip, for example a detector chip for computed tomography application, comprises a number of low-noise high-sensitive inputs/outputs which have to be connected to the external world, the connecting signals are often susceptible to noise disturbances. Furthermore, high-frequency inputs/outputs are susceptible to external disturbances and parasitics.

It may be desirable to have an improved signal transmission through the wafer.

According to an exemplary embodiment of the present invention, an Electrically Shielded Through-Wafer Interconnect (TWI) may be provided, comprising a wafer, a first through-wafer interconnect structure and a second through-wafer interconnect structure, wherein the second through-wafer interconnect structure is coaxially arranged around the first through-wafer interconnect structure.

Thus, according to this exemplary embodiment of the present invention, the susceptibility of the first through-wafer interconnect structure with respect to external components and/or internal parts may be reduced by the provision of a shielding structure in form of a second through-wafer interconnect structure in the form of a coaxial connection.

The technology of the Trough Wafer Interconnection (TWI) may allow the 3D-interconnection of chips (especially CMOS chips/CMOS imagers) with interconnections from the CMOS frontside (or other process) to a bump ball on the backside. This option avoids connection pads at the side of the chip which prevent an all side placement of these chips directly next to each other (in the same pixel pitch e.g. for imagers) which is very important for large area detectors in computed tomography for example. The use of this TWI technology may allow also the 3D-module design of different chips, which makes this technology interesting for all semiconductor applications.

A possible implementation of TWI is to etch trenches of certain geometry from the topside on a raw CMOS wafer. These trenches may be filled with doped polysilicon or any other conducting material. The CMOS process is placed on top. Once finished, the TWIs are opened from the back-side by thinning. The last step is back-side metallization and placement of the contacts (i.e. bumps) Other TWI methods may also benefit from the present invention.

According to another exemplary embodiment of the present invention, the wafer comprises a Complementary Metal Oxide Semiconductor structure with a first metallic region, wherein the first through-wafer interconnect structure is connected to the first metallic region of the Complementary Metal Oxide Semiconductor structure (CMOS structure).

Therefore, the first through-wafer interconnect structure may be adapted for transmitting signals from or to the metallic region of the CMOS through the wafer while being at the same time electrically shielded by the second through-wafer interconnect structure.

According to another exemplary embodiment of the present invention, the second through-wafer interconnect structure is connected to a second metallic region of the CMOS structure, wherein the first through-wafer interconnect structure has a first depth and wherein the second through-wafer interconnect structure has a second depth which is smaller than the first depth.

Therefore, the second through-wafer interconnect structure may not lead all way through the wafer but may only reach to a certain depth. Consequently, the second through-wafer interconnect structure may be buried inside the wafer, whereas the first through-wafer interconnect structure may reach through the wafer to the back-side of the wafer.

According to another exemplary embodiment of the present invention, the second through-wafer interconnect structure is a closed structure.

By closing the shielding second interconnect structure coaxially around the first interconnect structure, an improved protection against external disturbances may be provided.

According to another exemplary embodiment of the present invention, the Through-Wafer Interconnect further comprises a third through-wafer interconnect structure coaxially arranged around the first through-wafer interconnect structure, wherein one of the second through-wafer interconnect structure and the third through-wafer interconnect structure is connected to a first potential, which may be a ground potential.

According to another exemplary embodiment of the present invention, the other one of the second through-wafer interconnect structure and the third through-wafer interconnect structure is connected to a second potential.

Therefore, according to this exemplary embodiment of the present invention, a triaxial structure based on TWIs may be provided, in which the middle ring maybe work as a guard-ring and may be connected to a specific potential. The outer ring may then be connected to ground, or vice versa. This may provide for a shielded transmission of sensible signals to the external world.

It should be noted, that even quarto-axial or other multi-axial structures may be provided according to an exemplary embodiment of the present invention, in which certain selected shielding rings are connected to respective potentials.

According to another exemplary embodiment of the present invention, the Through-Wafer Interconnect may further comprise a bump or a re-routing layer for connecting the second through-wafer interconnect structure to the first potential.

According to another exemplary embodiment of the present invention, a detecting element for application in an examination apparatus may be provided, the detecting element comprising a wafer with a sensitive region adapted for detecting radiation or energetic particles, the detected radiation or particles resulting in a detection signal, and a first through-wafer interconnect structure adapted for transmitting the detection signal from the sensitive region through the wafer to a first interface, and a second through-wafer interconnect structure adapted for shielding the detection signal during transmission of the detection signal through the wafer. The second through-wafer interconnect structure is coaxially arranged around the first through-wafer interconnect structure.

Thus, the susceptibility of the inner interconnection to external components and/or internal parts may be reduced by providing a shielding structure in the form of a coaxial outer through-wafer interconnect structure.

According to another exemplary embodiment of the present invention, the detecting element is part of a large-area tile detector.

According to another exemplary embodiment of the present invention, an examination apparatus for examination of an object of interest may be provided, the examination apparatus having a detecting element comprising a wafer, a first through-wafer interconnect structure and a second through-wafer interconnect structure according to the above described detecting element.

Furthermore, according to another exemplary embodiment of the present invention, the examination apparatus may be applied as a baggage inspection apparatus, a medical application apparatus, a material testing apparatus or a material science analysis apparatus. A field of application of the invention may be baggage inspection.

According to another exemplary embodiment of the present invention, the examination apparatus may be selected from the group consisting of Computed Tomography (CT) imaging system, Coherent Scatter Computed Tomography (CSCT) imaging system, Positron Emission Tomography (PET) imaging system, and Single Photon Emission Computerized Tomography (SPECT) imaging system. Therefore, diagnostic tools for different diagnosis may be provided.

Furthermore, according to another exemplary embodiment of the present invention, a method of fabricating an electrically shielded Through-Wafer Interconnect may be provided, the method comprising the steps of providing a wafer, fabricating a first through-wafer interconnect structure and fabricating a second through-wafer interconnect structure, wherein the second through-wafer interconnect structure is coaxially arranged around the first through-wafer interconnect structure.

It may be seen as the gist of an exemplary embodiment of the present invention that the susceptibility of interconnections through a wafer may be reduced by providing a shielding structure in the form of a coaxial, triaxial or other multi-axial connection. This may provide for an improved signal transmission of, for example, high precision analogue signals or high-frequency signals, both analogue and digital. Furthermore, the shielding geometry may suppress leakage currents, as there are several "isolation-borders" between the signal and the substrate.

These and other aspects of the present invention will become apparent from and elucidated with reference to the embodiment described hereinafter.

Exemplary embodiments of the present invention will be described in the following, with reference to the following drawings.

The illustration in the drawings is schematically. In different drawings, similar or identical elements are provided with the same reference numerals.

Figure 1:
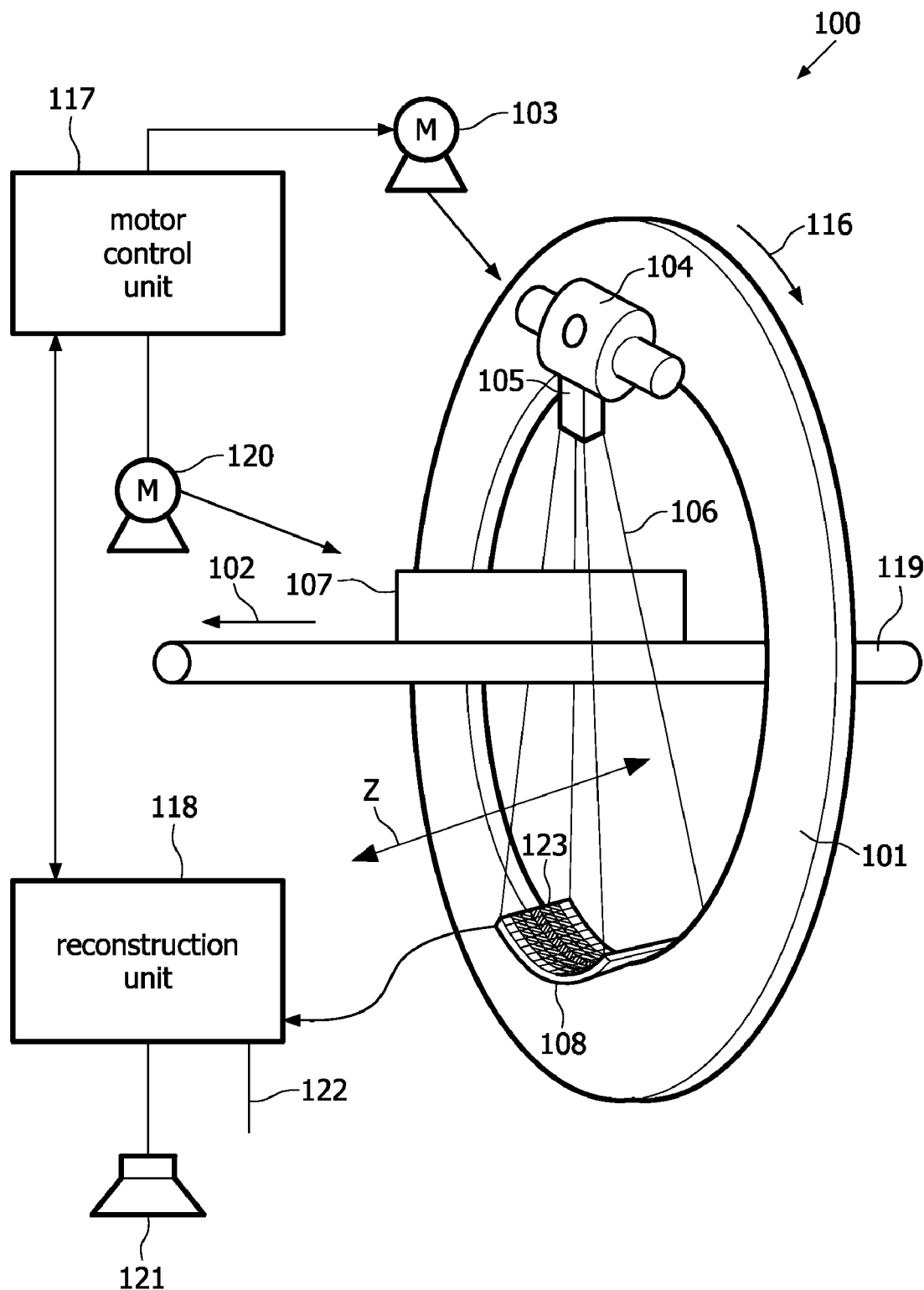
FIG. 1 shows a simplified schematic representation of an embodiment of a CT scanner according to the present invention.

FIG. 1 shows an exemplary embodiment of a CT scanner system according to an exemplary embodiment of the present invention. With reference to this exemplary embodiment, the present invention will be described for the application in baggage inspection to detect hazardous materials, such as explosives, in items of baggage. However, it should be noted that the present invention is not limited to this application, but may also be applied in the field of medical imaging, or other industrial applications, such as material testing.

The computer tomography apparatus 100 depicted in FIG. 1 is a cone-beam CT scanner. However, the invention may also be carried out a with a fan-beam geometry or with other scanning systems, such as CSCT, PET, SPEC or MR imaging systems. The CT scanner depicted in FIG. 1 comprises a gantry 101, which is rotatable around a rotational axis 102. The gantry 101 is driven by means of a motor 103. Reference numeral 104 designates a source of radiation such as an X-ray source, which, according to an aspect of the present invention, emits a polychromatic radiation.

Reference numeral 105 designates an aperture system which forms the radiation beam emitted from the radiation source to a cone-shaped radiation beam 106. The cone-beam 106 is directed such that it penetrates an object of interest 107 arranged in the centre of the gantry 101, i.e. in an examination region of the CT scanner, and impinges onto the detector 108. As may be taken from FIG. 1, the detector 108 is arranged on the gantry 101 opposite to the source of radiation 104, such that the surface of the detector 108 is covered by the cone-beam 106. The detector 108, which is depicted in FIG. 1, comprises a plurality of detector elements 123 comprising a wafer with a sensitive region adapted for detecting radiation or energetic particles, the detected radiation or particles resulting in a detection signal, a first through-wafer interconnect structure adapted for transmitting the detection signal from the sensitive region through the wafer to a first interface, and a second through-wafer interconnect structure adapted for shielding the detection signal during transmission of the detection signal through the wafer. Hereby, the second through-wafer interconnect structure is coaxially arranged around the first through-wafer interconnect structure.

During a scan of the object of interest 107, the source of radiation 104, the aperture system 105 and the detector 108 are rotated along the gantry 101 in the direction indicated by arrow 116. For rotation of the gantry 101 with the source of radiation 104, the aperture system 105 and the detector 108, the motor 103 is connected to a motor control unit 117, which is connected to a calculation or determination unit 118.

In FIG. 1, the object of interest 107 is an item of baggage [or a patient] which is disposed on a conveyor belt 119. During the scan of the object of interest 107, while the gantry 101 rotates around the item of baggage 107, the conveyor belt 119 displaces the object of interest 107 along a direction parallel to the rotational axis 102 of the gantry 101. By this, the object of interest 107 is scanned along a helical scan path. The conveyor belt 119 may also be stopped during the scans to thereby measure single slices. Instead of providing a conveyor belt 119, for example, in medical applications where the object of interest 107 is a patient, a movable table may be used. However, it should be noted that in all of the described cases it may also be possible to perform a circular scan, where there is no displacement in a direction parallel to the rotational axis 102, but only the rotation of the gantry 101 around the rotational axis 102.

Further, it shall be emphasized that, as an alternative to the cone-beam configuration shown in FIG. 1, the invention may be realized by a fan-beam configuration. In order to generate a primary fan-beam, the aperture system 105 may be configured as a slit collimator.

The detector 108 may be connected to the determination unit 118. The determination unit 118 may receive the detection result, i.e. the read-outs from the detector elements 123 of the detector 108 and may determine a scanning result on the basis of the read-outs. Furthermore, the determination unit 118 communicates with the motor control unit 117 in order to coordinate the movement of the gantry 101 with motors 103 and 120 with the conveyor belt 119.

The determination 118 may be adapted for constructing an image from read-outs of the detector 108. A reconstructed image generated by the calculation unit 118 may be output to a display (not shown in FIG. 1) via an interface 122.

The determination unit 118 may be realized by a data processor to process read-outs from the detector elements 123 of the detector 108.

Furthermore, as may be taken from FIG. 1, the determination unit 118 may be connected to a loudspeaker 121, for example, to automatically output an alarm in case of the detection of suspicious material in the item of baggage 107.

The computer tomography apparatus 100 comprises the X-ray source 104 adapted to emit X-rays to the object of interest 107. The collimator 105 provided between the electromagnetic radiation source 104 and the detecting elements 123 is adapted to collimate an electromagnetic radiation beam emitted from the electromagnetic radiation source 104 to form a cone-beam. Alternatively, not shown in FIG. 1, a slit collimator may be used instead of collimator 105 to produce a fan-beam. The detecting elements 123 form a multi-slice detector array 108. The computer tomography apparatus 100 is configured as a baggage inspection apparatus.

The detector 108 may be adapted as a large-area tile detector having a plurality of detecting elements 123. The detector chips 123 may be tiled in different directions. In order to allow for the use of cost-effective substrates, such as, for example, CMOS technology, through-wafer interconnections may be used for transmitting signals from a sensitive region of a detecting element to the back side of the wafer.

Both inputs and outputs of the TWI may, according to an exemplary embodiment of the present invention, be shielded against external disturbances by using coaxial or triaxial structures implemented in TWI technology. This process may be applied for a large number of semiconductor applications, not only medical or material testing systems.

Figure 2:
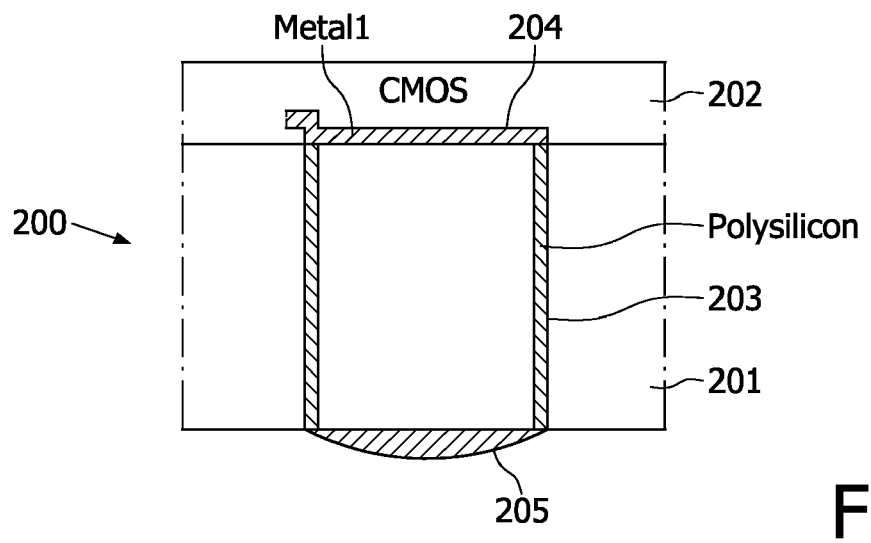
FIG. 2 shows a basic TWI structure.

FIG. 2 shows a basic TWI structure of a chip 200, which may be applied as a detector for computed tomography application. Here, a low-noise input/output 204 has to be connected to the external world. Connecting signals, which are very susceptible to noise disturbances, to external components is a delicate matter. Connecting the signals from the metallic region 204 of the CMOS structure 202 to the external world may be performed by vias 203 or through-wafer interconnections 203, which may be adapted in form of polysilicone TWIs. The TWIs 203 penetrate the substrate 201 and are connected to a bump 205 on the back side of the wafer, hence allowing to tile a number of detector elements for large area detectors.

As may be seen from FIG. 2, the front-side pre-processed TWI is contacted to the front-side metal 204 (of any layer) during the CMOS front-side process. Then, the wafer is thinned from the back-side such that the TWI is left open. Then, a back-side process and bump placement 205 enable to contact the chip to any substrate (or other interfaces).

It should be noted that the cross-sectional shape of such a TWI, seen from top or bottom, may be circular, rectangular, or of any other shape. It may even have the shape of an open structure, such as a semi-circle.

Furthermore, it should be noted, that the contacting material may be on the trenches and not between trenches as conductor. This may provide with a good electrical contact since additional conducting material is used and not the substrate.

However, in order to further reduce the impact of external influences on the signal quality, the TWIs 203 may be shielded according to an exemplary embodiment of the present invention.

This shielding may be performed by an implementation of integrated coaxial, triaxial or multi-axial structures at the input and output nodes. This may improve the shielding capabilities against external disturbances and also may ensure a much lower leakage (or better leakage path). Furthermore, inter-chip disturbances among the different inputs and outputs may be prevented. The coaxial and triaxial structures may also prevent a specific output/input to disturb any other parts of the chip since no leakage will reach the substrate.

Figure 3:
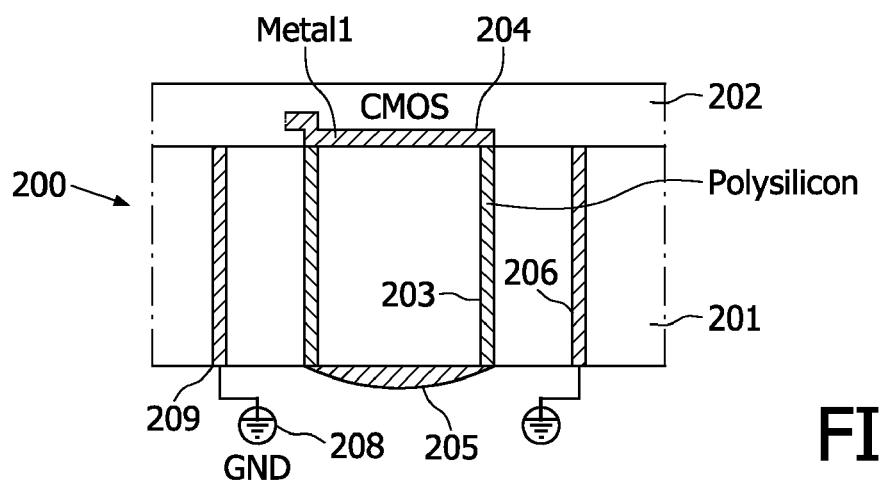
FIG. 3 shows a coaxial structure based on TWI according to an exemplary embodiment of the present invention.

The coaxial structure 203, 206 depicted in FIG. 3 is based on TWI. Here, the through-wire interconnect structure 203 of FIG. 2 is surrounded by a second through-wire interconnect structure 206. This outer structure 206 may be connected to any fixed potential (ground or supply), as depicted by ground potential 208, or to any other signal.

The uses of such outer structures 206 are manifold. The main benefit though may be the following: In case of a leakage from the inner TWIs 203, the outer ring 206 may prevent any disturbance to neighbouring TWIs/chip-nodes. It may also prevent that any disturbance from other TWIs/chip-nodes may affect the inner structure 203. For example, the outer ring may be adapted in form of a closed structure surrounding completely the inner TWI.

In order to connect the outer ring 206 to the ground potential 208 (or other any potential), the back-side of the outer ring 209 may be contacted by placing an additional bump (such as bump 205, but not depicted in the figure) or by having a re-routing layer in the back-side (which is not depicted in the figure).

Figure 4:
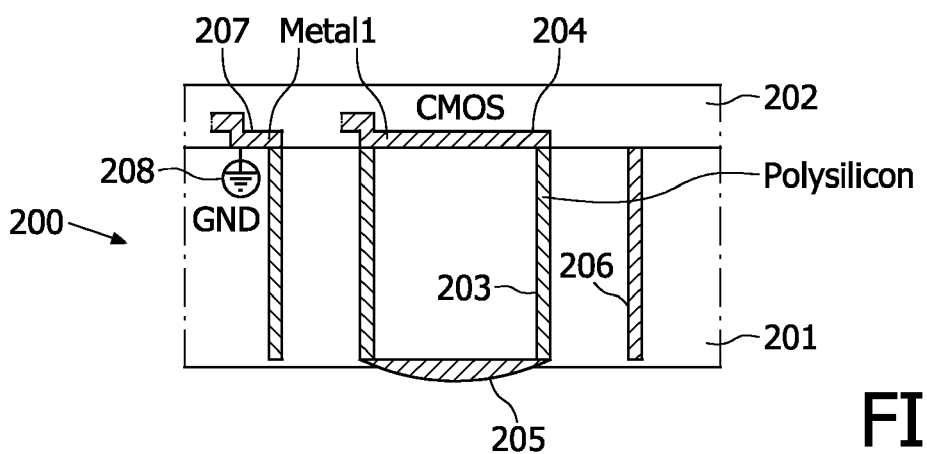
FIG. 4 shows a coaxial structure based on TWI with an outer ring connected at the CMOS process side according to an exemplary embodiment of the present invention.

Another implementation according to another exemplary embodiment of the present invention is shown in FIG. 4, in which the outer ring 206 is electrically connected at the CMOS process side. Instead of contacting the outer ring 206 from the back-side, the CMOS process is used to provide the contact of a fixed potential 208 to the outer ring 206. In other words, the second through-wafer interconnect structure 206 is connected to a second metallic region 207 of the CMOS structure 202. It should be noted, that the first metallic region and the second metallic region may be located in the same metallic layer or in different metallic layers.

Figure 5:
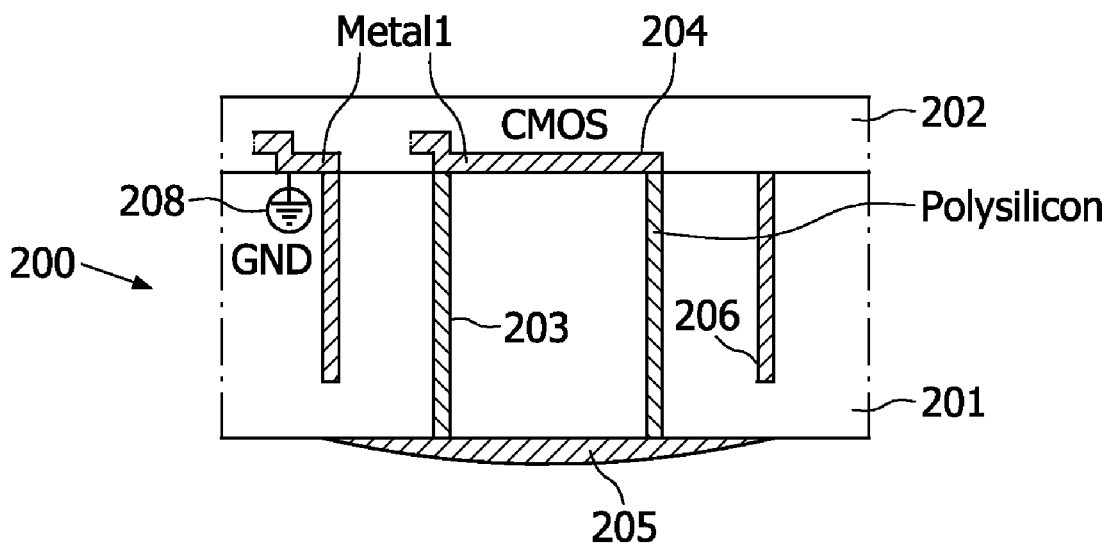
FIG. 5 shows a coaxial structure based on TWI with an outer ring connected at the CMOS process side and limited in depth according to an exemplary embodiment of the present invention.

In some cases it may not be necessary to have the outer ring 206 all way through the wafer. This exemplary embodiment is depicted in FIG. 5, in which the outer ring 206 is connected at the CMOS process side and limited in depth. In other words, the outer ring 206 is buried in the substrate 201. The fabrication of such a structure may be easy to control, since the depth of the TWI also depends on its width. Therefore, by reducing the width of the outer interconnect 206 with respect to inner interconnect 203, the outer TWI 206 may not reach the depth of the inner TWI 203.

Figure 6:
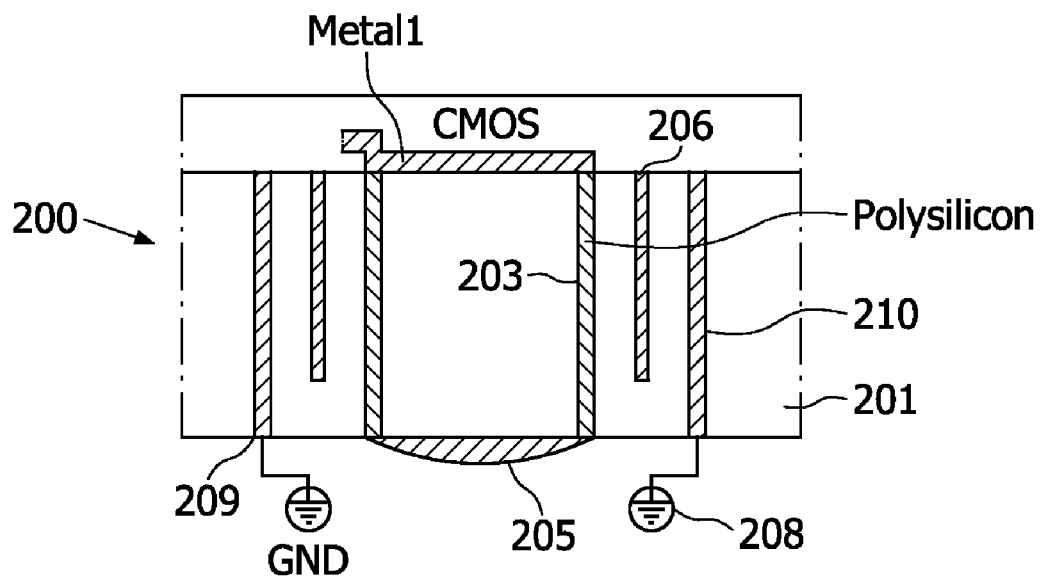
FIG. 6 shows a triaxial structure based on TWIs according to an exemplary embodiment of the present invention.

FIG. 6 shows the implementation of a triaxial structure according to an exemplary embodiment of the present invention. As may be seen from FIG. 6, the triaxial structure comprises an inner TWI 203, a middle TWI 206 and an outer TWI

210. The outer TWI 210 runs all the way through the substrate 201 and is connected to ground potential 208. The middle TWI 206 does not reach the back-side of the substrate 209 and may be connected to a potential in the way of TWI 206 depicted in FIG. 5. The middle TWI ring 206 may be connected to a specific potential to work as a guard-ring and the outer TWI ring 210 may be connected to ground 208, or vice versa. This may provide for a maximum shielding.

It should be noted that, although the present invention is applied in the field of computed tomography, especially as a large-area tile detector, it may also be used for different applications in the field of baggage examination or semiconductor processing and semiconductor applications.

It should be noted that the term "comprising" does not exclude other elements or steps and the "a" or "an" does not exclude a plurality and that a single processor or system may fulfil the functions of several means or units recited in the claims. Also elements described in association with different embodiments may be combined.

It should also be noted, that any reference signs in the claims shall not be construed as limiting the scope of the claims.

The invention claimed is:

1. An electrically shielded Through-Wafer Interconnect, comprising:
    a wafer;
    a first through-wafer interconnect structure; and
    a second through-wafer interconnect structure;
        wherein the second through-wafer interconnect structure, thereby having a coincident axis, and completely surrounding the first through-wafer interconnect structure in a plane perpendicular to the coincident axis is coaxially arranged around the first through-wafer interconnect structure and wherein the wafer comprises a Complementary Metal Oxide Semiconductor structure with a first metallic region;
        wherein the first through-wafer interconnects structure is connected to the first metallic region of the Complementary Metal Oxide Semiconductor structure;
        wherein the second through-wafer interconnect structure is connected to a second metallic region of the Complementary Metal Oxide Semiconductor structure;
        wherein the first through-wafer interconnect structure has a first depth; and
        wherein the second through-wafer interconnect structure has a second depth which is smaller than the first depth.

2. The Through-Wafer Interconnect of claim 1,
    further comprising a third through-wafer interconnect structure coaxially arranged around the first through-wafer interconnect structure;
    wherein one of the second through-wafer interconnect structure and the third through-wafer interconnect structure is connected to a first potential; and
    wherein the first potential is a ground potential.

3. The Through-Wafer Interconnect of claim 2,
    wherein the other one of the second through-wafer interconnect structure and the third through-wafer interconnect structure is connected to a second potential.

4. The Through-Wafer Interconnect of claim 2,
    further comprising a bump or a re-routing layer for connecting the second through-wafer interconnect structure to the first potential.

5. A method comprising:
    fabricating a first through-wafer interconnect structure;
    fabricating a second through-wafer interconnect structure, having a coincident axis with the first through-wafer interconnect structure, and completely surrounding the first through-wafer interconnect structure in a plane perpendicular to the coincident axis;
    connecting the first through-wafer interconnect structure to the first metallic region of the Complementary Metal Oxide Semiconductor structure such that the first through-wafer interconnect structure directly touches the first metallic region of the Complementary Metal Oxide Semiconductor structure; and
    connecting the second through-wafer interconnect structure to a second metallic region of the Complementary complimentary Metal Oxide Semiconductor structure such that the second through-wafer interconnect structure physically touches the second metallic region of the Complementary Metal Oxide Semiconductor structure;
    wherein the second through-wafer interconnect structure is coaxially arranged around the first through-wafer interconnect structure.

6. The method of claim 5, wherein the second through-wafer interconnects structure is connected to the second metallic region of the Complementary Metal Oxide Semiconductor structure by virtue of being at least partially adjacent to the second metallic region of the Complementary Metal Oxide Semiconductor structure.

7. The method of claim 5, wherein the first through-wafer interconnects structure is connected to the first metallic region of the Complementary Metal Oxide Semiconductor structure by virtue of being at least partially adjacent to the first metallic region of the Complementary Metal Oxide Semiconductor structure.

8. The method of claim 5 further comprising fabricating a third through-wafer interconnect structure coaxially arranged around the first through-wafer interconnect structure.

9. The method of claim 8 wherein the second and third through-wafer interconnect structures are fabricated of different depths.

10. The method of claim 8 wherein at lest one of the second and third through-wafer interconnect structure is connected to a second metallic region of the Complementary Metal Oxide Semiconductor structure.

11. The method of claim 5, where the first metallic region and the second metallic region are physically separated from one another and where the first metallic region and the second metallic region are longitudinally positioned along a plane.

12. The method of claim 5, where the first through-wafer interconnect structure, which is connected to the first metallic region of the Complementary Metal Oxide Semiconductor structure, is connected to the second through-wafer interconnect structure, which is connected to the second metallic region of the Complementary Metal Oxide Semiconductor structure, and forms an electrically shielded Through-Wafer Interconnect, the method comprising:
    incorporating the electrically shielded Through-Wafer Interconnect into a detector element.

13. The method of claim 12, comprising:
    incorporating the detector element into a computed tomography configured examination apparatus.

14. The method of claim 5, where the first metallic region and the second metallic region are located in the same metallic layer.

15. The method of claim 5, where the first metallic region and the second metallic region are located in different metallic layers.

* * * * *